United States Patent [19]

Reichert et al.

[11] Patent Number: 4,496,791

[45] Date of Patent: Jan. 29, 1985

[54] SPRING-BIASED CONNECTOR FOR ELECTRICALLY BONDING A DEVICE TO A SUPPORTING WALL

[75] Inventors: Gilbert A. Reichert, Greendale; Donald K. Schuette, Cedarburg, both of Wis.

[73] Assignee: Allen-Bradley Company, Milwaukee, Wis.

[21] Appl. No.: 434,040

[22] Filed: Oct. 13, 1982

[51] Int. Cl.[3] .......... H05K 5/02

[52] U.S. Cl. .......... 174/51; 174/65 R; 200/296; 338/197

[58] Field of Search .......... 174/51, 64, 65 R, 65 SS, 174/78; 285/161; 200/296; 338/197

[56] References Cited

U.S. PATENT DOCUMENTS

| | | | |
|---|---|---|---|
| 675,127 | 5/1901 | Cole | 174/51 |
| 1,688,853 | 10/1928 | Clayton | 285/194 |
| 1,855,447 | 4/1932 | Hagstedt | 174/51 |
| 1,880,081 | 9/1932 | Frederickson | 174/51 |
| 2,301,786 | 11/1942 | Millermaster | 174/51 |
| 2,862,040 | 11/1958 | Curran | 174/51 |
| 3,104,120 | 9/1963 | Myers | 174/65 R |
| 4,198,537 | 4/1980 | Mariani | 174/65 R |

*Primary Examiner*—A. T. Grimley
*Assistant Examiner*—D. A. Tone
*Attorney, Agent, or Firm*—Arnold J. Ericsen

[57] ABSTRACT

A mounting assembly for mounting an electrical device on a supporting wall of conductive material and including a flanged bushing of conductive material with an integral threaded stem portion extending through an aperture in the wall, and a threaded fastener engaging the stem portion to deflect a flat spring member seated between the flange of the bushing and the inner wall surface. The spring member laterally extending marginal areas defining outer edges with serrated portions to thereby cause the serrated portions to bite into said wall surface, to thereby complete an electrically bonded circuit between said bushing and said wall.

4 Claims, 5 Drawing Figures

*Fig. 1*
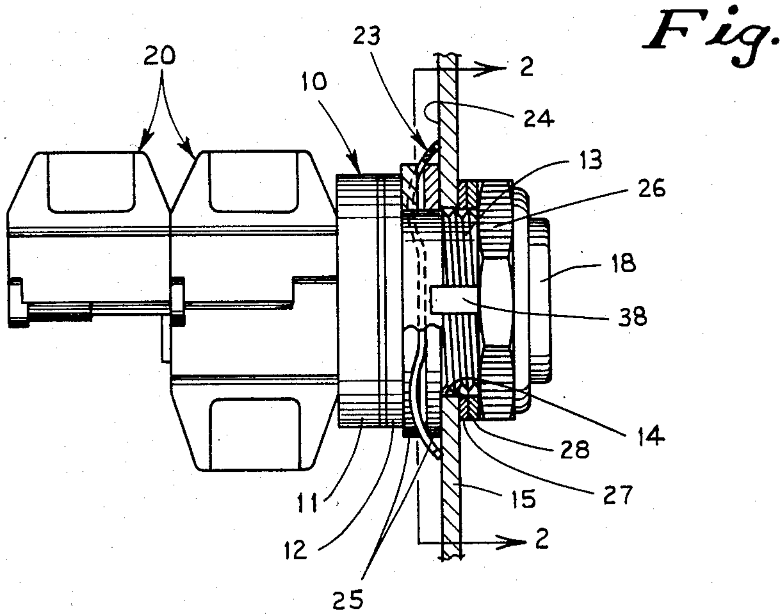
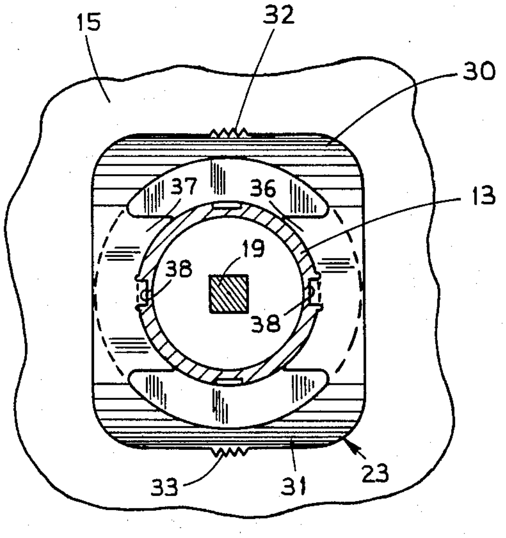
*Fig. 2*
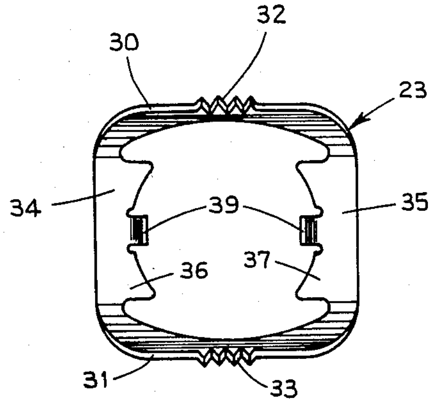
*Fig. 3*
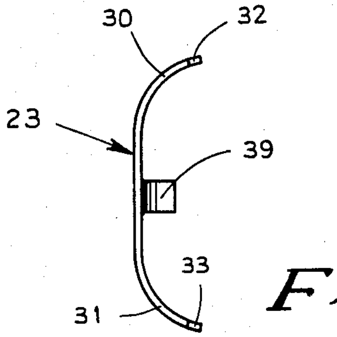
*Fig. 4*
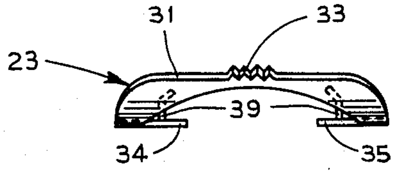
*Fig. 5*

SPRING-BIASED CONNECTOR FOR ELECTRICALLY BONDING A DEVICE TO A SUPPORTING WALL

BACKGROUND OF THE INVENTION

The present invention is directed to an assembly for mounting an electrical device on a supporting, grounded wall with particular reference to a spring-biased connector member for completing a bonding circuit between the electrical device and its grounded supporting wall surface.

The term "bonding" is defined at Article 100 of the *National Electrical Code* 1981 as, "The permanent joining of metallic parts to form an electrically conductive path which will assure electrical continuity in the capacity to conduct safely any current likely to be imposed." Prior art connector members or jumpers have usually been in the form of wire-like conductors soldered directly to a housing and to electrical equipment mounted in the housing, or fastened by means of terminal screws on projecting ears somewhat similar to the arrangement shown in the Frederickson U.S. Pat. No. 1,880,081 or as shown in the Millermaster U.S. Pat. No. 2,301,786. The usual grounding device in the form of a nut fitting the threaded conduit as it enters an enclosure is shown in the Cole U.S. Pat. No. 675,127 and the Hagstedt U.S. Pat. No. 1,855,447, both of which illustrate threaded devices having barbs or projections which bite into an enclosure.

SUMMARY OF THE INVENTION

The present invention provides a spring-biased, apertured flat spring member which surrounds the stem portion of a bushing projecting from electrical equipment, such as a pushbutton switch, mounted on a grounded wall of an enclosure or panel. Both the mounting wall surface and the bushing are made of conductive material, and the flat spring member is arranged to be clamped between the flanged base of the bushing and the inner surface of the enclosure wall. The clamping pressure causes the spring member to be flattened with its outer edge scraping the wall surface to insure electrical contact and completion of the bond between the bushing and the wall of the enclosure or panel. It is preferred to serrate the outer edges of at least a portion of the marginal edge to insure that the bonding member will "bite" into the surface of the supporting wall.

The relatively flat spring member of the present invention, except for a deflectable raised portion providing the resilient spring effect, is quite thin and requires minimal space. In fact, the novel design provides the required function without modification of either the supporting wall, or the electrical equipment supported thereon.

It is therefore a primary object of the present invention to provide an assembly for mounting an electrical device to an apertured supporting wall of conductive material, and wherein a bushing of conductive material has a stem portion extending through the aperture and an integral flanged portion adjacent a supporting wall surface and, further, wherein the combination includes an apertured flat spring member seated on and surrounding the stem portion of the bushing and in abrasive contact therewith and having at least one laterally extending marginal area with an outer edge portion in abrasive contact with the wall surface. The spring member has a deflectable raised portion adapted to be compressed to cause the marginal area to be forcibly extended outwardly with the outer edge portion biting into the wall surface to thereby complete an electrically bonded circuit between the conductive bushing and the supporting wall surface.

Other objects and features of the invention will be pointed out in the following description and claims illustrated in the accompanying drawing, which disclose, by way of example, the principle of the invention, and the best mode which has been contemplated for carrying it out.

BRIEF DESCRIPTION OF THE DRAWINGS

FIG. 1 is a side elevational view of the completed assembly of electrical equipment in the form of a pushbutton device mounted in an apertured supporting enclosure wall;

FIG. 2 is a cross sectional view taken along lines 2—2 of FIG. 1;

FIG. 3 is a plan view of the flat spring bonding member;

FIG. 4 is a side elevational view of the spring member of FIG. 3; and

FIG. 5 is a side elevational view taken 90° relative to the view of FIG. 4.

DESCRIPTION OF THE PREFERRED EMBODIMENT

With reference to the drawing, and particularly to FIG. 1, it will be observed that the present invention finds immediate application in providing an electrical bonding connection between an electrical pushbutton device, indicated generally by the reference numeral 10 and having a flanged bushing 11 of conductive material defining an integrally die cast metal flange portion 12 and a threaded stem portion 13. The stem portion 13 extends through an aperture 14 of a supporting wall 15 of conductive material formed from a metal stamping or a die cast enclosure. Bushings, such as the member 11, are usually die cast of zinc or aluminum. The pushbutton includes a manual operating button 18 having an actuator 19 (see FIG. 2) extending inwardly of the enclosure to engage contact operators (not shown) mounted interiorly of the modules 20, which are fully described in U.S. Pat. No. 3,514,554, granted to Gerd C. Boysen and assigned to the same assignee as the present invention.

The novel bonding member, or jumper, indicated generally by the reference numeral 23, is seated on and surrounds the stem portion 13 of the bushing 11. The spring member 23 is clamped between the radially extending flange portion 12 of the bushing 11 and the inner wall surface 24 of the supporting wall 15. There is also supplied a plurality of sealing gaskets 25 guarding against contaminants which may enter through the panel or wall aperture 14. Fastening means in the form of an octagonal mounting ring 26 threadingly engages the stem portion 13 of the bushing 11. Either a trim washer 27 or a legend plate (not shown) may be used at the outer side of the panel, along with a thrust washer 28 provided to absorb the tightening torque and permit the trim washer or legend plate to remain in alignment.

The novel flat spring bonding member 23 will next be described with particular reference to FIGS. 2–5, inclusive. The bonding member 23 may be rectangular in shape and is manufactured from flat stock. In the preferred embodiment, the member 23 is comprised, for instance, of 0.012" C.R. carbon spring steel which is soft annealed for forming, and hardened to a Rockwell R15N 82–85 hardness. The member 23 includes oppositely disposed marginal edges 30 and 31 which include serrated portions 32 and 33, respectively. The marginal edges 30 and 31 are further formed to be bent downwardly (see FIG. 4) to provide a means of deflecting the otherwise flat spring member.

The remaining oppositely disposed sides 34 and 35 are relatively flat and have inwardly extending portions 36 and 37, the innermost edges of which slidably engage opposite sides of the stem portion 13, as shown in FIG. 2. As shown in FIGS. 1 and 2, the stem portion 13 of the bushing 11 further includes axially disposed slots or grooves 38 for receiving the diametrically opposed tongues 39 extending inwardly from the edges 34 and 35, respectively. The tongues 39 prevent the spring member from rotating about the stem 38.

It will thus be apparent that a facile and economically manufactured bonding connecting member or jumper has been provided for use in completing a bonded and grounded circuit between an electrical device, such as a pushbutton switch 10 and its grounded enclosure supporting wall 15. It will be observed by comparing FIG. 4 with FIG. 1 that the member 23 will be deflected from the normal position of FIG. 4 to the deflected or flattened position of FIG. 1 when the threaded mounting ring 26 is tightened in threading engagement with the stem 13. This will cause the marginal edges 30 and 31 to be forcibly extended. This action, in turn, causes the serrations 32 and 33 to abrasively engage or bite into the inner wall surface 24 of the supporting wall 15. Thus, a good electrical connection will be made as the serrations bite through oxide layers, corrosive layers or painted layers of the inner wall 24. At the same time, the tongues 39 will also be forced inwardly to abrade and tightly grasp the conductive stem portion of the bushing 11 to complete the circuit.

The embodiments of the invention of which an exclusive property or privilege is claimed are defined as follows:

1. In a mounting assembly for mounting an electrical device on a supporting wall of conductive material and defining an aperture therein, a bushing of conductive material having a flanged portion positioned adjacent a first surface of said supporting wall and an integral stem portion extending through said aperture and defining a groove extending along the longitudinal axis of said stem portion, and fastening means engaging the stem portion of said bushing and the opposite surface of said supporting wall; the combination therewith of an apertured flat spring member surrounding and engaging the stem portion of said bushing and defining at least one laterally extending marginal area including an outer edge having a portion in abrasive contact with said first wall surface, said flat spring member including an inwardly extending tab portion slidably engaging the groove of said stem portion and further including a deflectable raised portion adapted to be compressed between said flanged portion and the first surface of said wall to cause the said marginal area to be forcibly extended outwardly with its outer edge portion biting into said wall to thereby complete an electrically bonded circuit between said bushing and said supporting wall.

2. The mounting assembly of claim 1, wherein the outer edge portion of said spring member comprises a plurality of serrations engaging said opposite wall surface.

3. The mounting assembly of claim 1, wherein said flat spring member is of generally rectangular configuration defining opposed marginal edges each including serrated portions and each being bowed in a direction towards said supporting wall.

4. The mounting assembly of claim 1, wherein the said fastening means and the said bushing stem portion are each compatibly threaded to provide a means of compressing the deflectable raised portion of said spring member to forcibly outwardly extend said serrated edge portion into biting relationship with said supporting wall.

* * * * *